(12) United States Patent
Wheelwright et al.

(10) Patent No.: US 9,773,934 B2
(45) Date of Patent: Sep. 26, 2017

(54) HYBRID TROUGH SOLAR POWER SYSTEM USING PHOTOVOLTAIC TWO-STAGE LIGHT CONCENTRATION

(71) Applicant: Sharp Laboratories of America (SLA), Inc., Camas, WA (US)

(72) Inventors: Brian Wheelwright, Tucson, AZ (US);
Wei Pan, Vancouver, WA (US);
Douglas Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 14/503,822

(22) Filed: Oct. 1, 2014

(65) Prior Publication Data
US 2016/0099367 A1    Apr. 7, 2016

(51) Int. Cl.
*H01L 31/054* (2014.01)
*H02S 40/22* (2014.01)
(Continued)

(52) U.S. Cl.
CPC ...... *H01L 31/0549* (2014.12); *H01L 31/0543* (2014.12); *H01L 31/0547* (2014.12);
(Continued)

(58) Field of Classification Search
CPC ............ H01L 31/0547; H01L 31/0543; H01L 31/0549; H01L 31/054; H02S 40/20; H02S 40/22
See application file for complete search history.

(56) References Cited

U.S. PATENT DOCUMENTS 4,350,837 A    9/1982  Clark
4,700,013 A    10/1987 Soule
(Continued)

FOREIGN PATENT DOCUMENTS

WO    WO2012076847    6/2012

OTHER PUBLICATIONS

Two-stage concentrator permitting concentration factors up to 300 x with one-axis tracking, Brunotte, M. et al., U. (Jan. 1, 1996). Solar Energy, 56, 3, 285-300.
(Continued)

*Primary Examiner* — Bethany L Martin
(74) *Attorney, Agent, or Firm* — Law Office of Gerald Maliszewski; Gerald Maliszewski

(57) ABSTRACT

A solar power method is provided using two-stage light concentration to drive concentrating photovoltaic conversion in conjunction with thermal collection. The method concentrates light rays received in a plurality of transverse planes towards a primary linear focus in an axial plane, which is orthogonal to the transverse planes. T band wavelengths of light are transmitted to the primary linear focus. R band wavelengths of light are reflected towards a secondary linear focus in the axial plane, which is parallel to the primary linear focus. The light received at the primary linear focus is translated into thermal energy. The light received at the secondary linear focus is focused by optical elements along a plurality of tertiary linear foci, which are orthogonal to the axial plane. The focused light in each tertiary primary focus is focused into a plurality of receiving areas, and translated into electrical energy.

14 Claims, 11 Drawing Sheets

(51) Int. Cl.
H02S 40/44 (2014.01)
F24J 2/08 (2006.01)
F24J 2/12 (2006.01)
F24J 2/18 (2006.01)

(52) U.S. Cl.
CPC .............. *H02S 40/22* (2014.12); *H02S 40/44* (2014.12); *F24J 2/08* (2013.01); *F24J 2/12* (2013.01); *F24J 2/18* (2013.01); *Y02E 10/52* (2013.01); *Y02E 10/60* (2013.01)

(56) References Cited

U.S. PATENT DOCUMENTS

| | | | |
|---|---|---|---|
| 4,964,713 A * | 10/1990 | Goetzberger | F24J 2/06 136/246 |
| 5,505,789 A | 4/1996 | Fraas et al. | |
| 7,569,764 B2 | 8/2009 | Shan et al. | |
| 8,410,351 B1 | 4/2013 | Gu | |
| 8,455,755 B2 | 6/2013 | Correia et al. | |
| 8,546,686 B2 | 10/2013 | Ashkin | |
| 2004/0079408 A1 * | 4/2004 | Fetzer | H01L 31/184 136/262 |
| 2004/0201900 A1 * | 10/2004 | Kurata | G02B 21/02 359/660 |
| 2007/0137690 A1 * | 6/2007 | Bruning | F24J 2/06 136/246 |
| 2011/0023866 A1 | 2/2011 | Divinadio et al. | |
| 2012/0279554 A1 | 11/2012 | Bostwick | |
| 2013/0220307 A1 | 8/2013 | Stettenheim | |
| 2013/0220312 A1 | 8/2013 | Stettenheim et al. | |
| 2013/0233750 A1 | 9/2013 | Ikuta | |
| 2013/0255753 A1 | 10/2013 | Escher et al. | |
| 2013/0306139 A1 | 11/2013 | Bostwick | |
| 2013/0314774 A1 | 11/2013 | Page et al. | |
| 2014/0026945 A1 | 1/2014 | Correia et al. | |
| 2014/0041708 A1 * | 2/2014 | Wang | H01L 31/0547 136/246 |
| 2014/0166077 A1 * | 6/2014 | Gupta | F24J 2/12 136/246 |
| 2015/0372640 A1 * | 12/2015 | Yang | H02S 40/22 136/248 |

OTHER PUBLICATIONS

"BICON: high concentration PV using one-axis tracking and silicon concentrator cells", Mohr, A et al, (Jan. 1, 2006). Progress in Photovoltaics, 14, 7, 663-674.

"Theory and design of line-to-point focus solar concentrators with tracking secondary optics", T. Cooper et al., Appl. Opt. vol. 52, 8586-8616 (2013).

"Spectral beam splitting technology for increased . . . ", A.G. Imenes et al., Solar Energy Materials & Solar Cells. vol. 84, pp. 19-69 (2004).

Thin-film multilayer filter designs for hybrid solar energy conversion systems, L. DeSandre et al., Proceedings of the SPIE vol. 562, pp. 155-159 (1986).

"Spectral selectivity applied to hybrid concentration systems", M.A. Hamdy et al., Proceedings of the SPIE vol. 562, pp. 147-154 (1986).

"Efficient hybrid photovoltaic-photothermal solar conversion system with cogeneration", D.E. Soule, E.F. Rechel, D.W. Smith, and F.A. Willis, SPIE vol. 562, pp. 166-173 (1985).

"Heat-Mirror Spectral Profile Optimization for TSC Hybrid Solar Conversion", D.E. Soule and S.E. Wood, SPIE vol. 653, p. 172-180 (1986).

Bandwidth and angle selective holographic films for solar energy applications, C.G. Stojanoff, J. Schulat, and M. Eich, SPIE vol. 3789, pp. 38-49 (1999).

"Optical modeling for a two-stage parabolic trough concentrating . . . ", S. Jian et al., Solar Energy Materials and Solar Cells vol. 94 1686-1696 (2010).

* cited by examiner

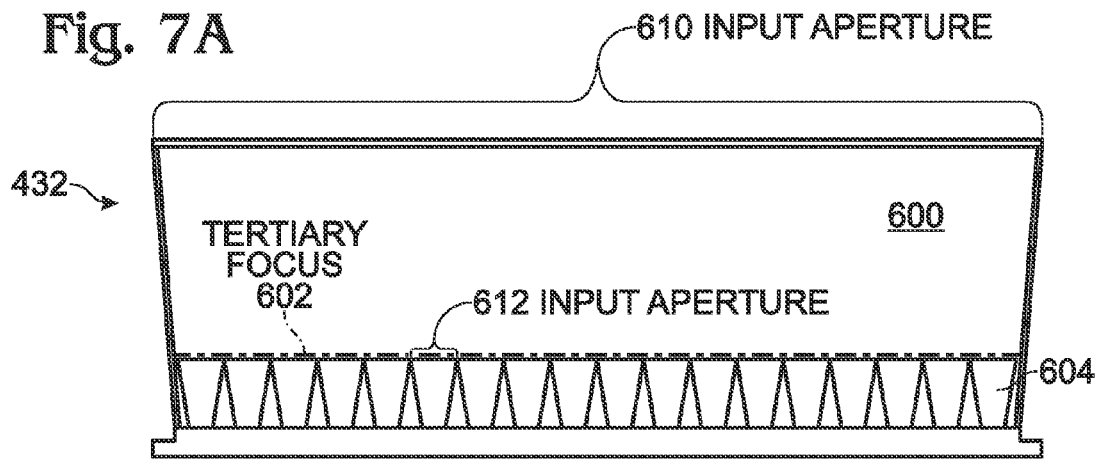
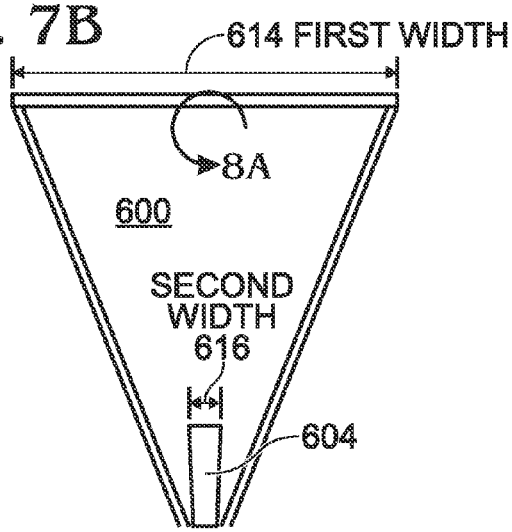
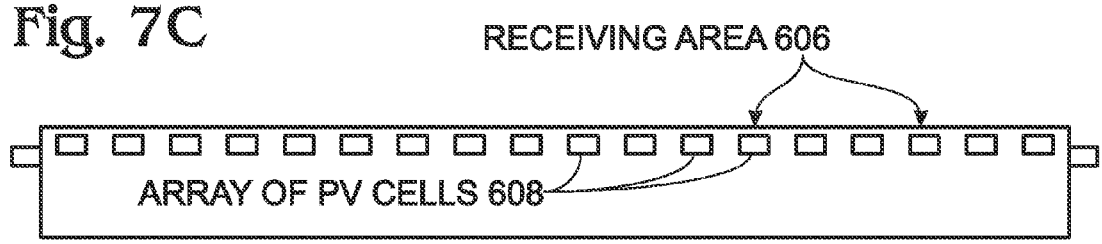

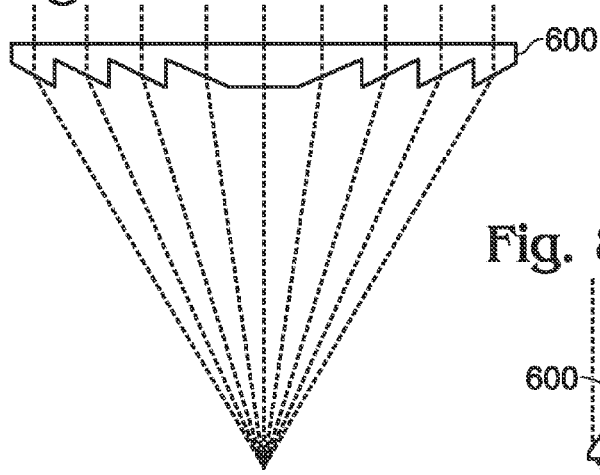
Fig. 8A
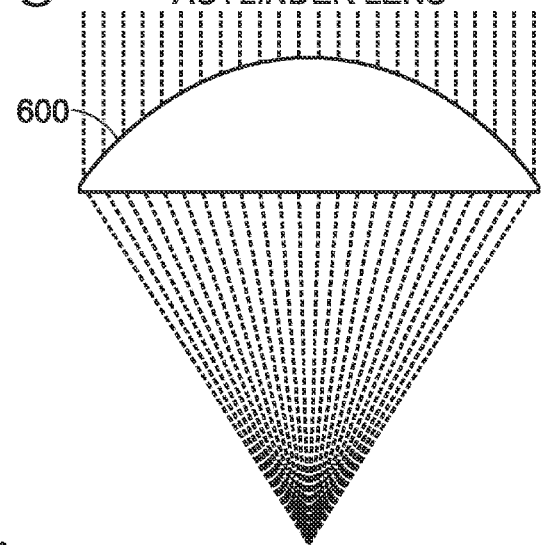
Fig. 8B ACYLINDER LENS
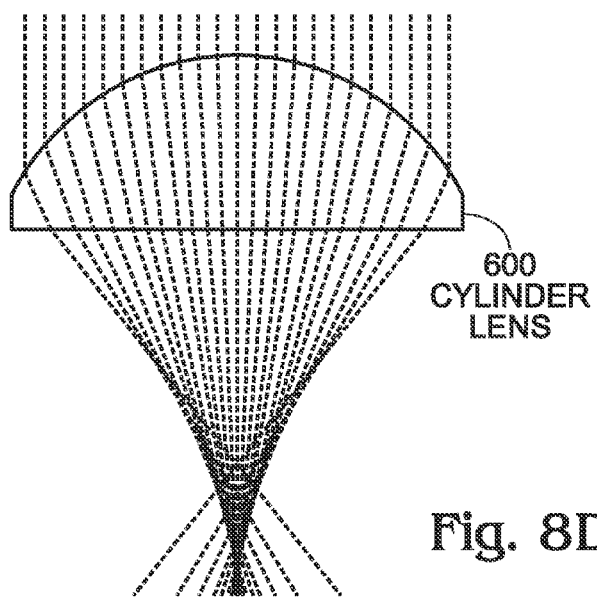
Fig. 8C
600 CYLINDER LENS
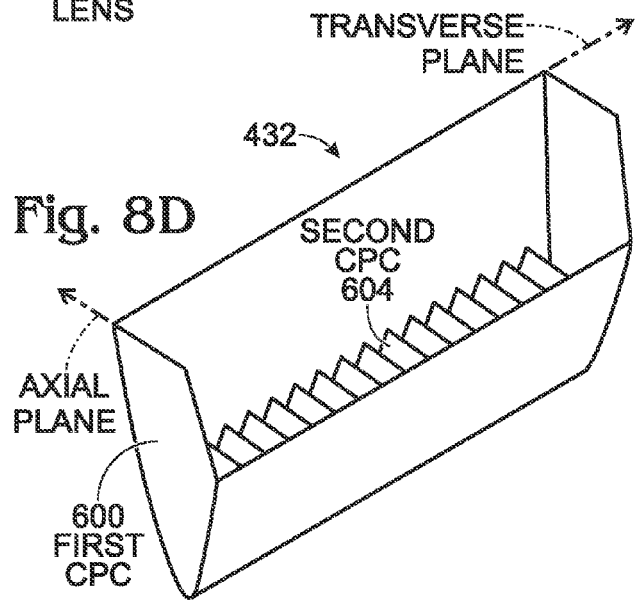
Fig. 8D

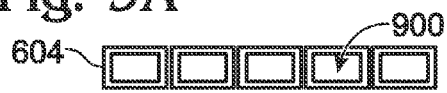
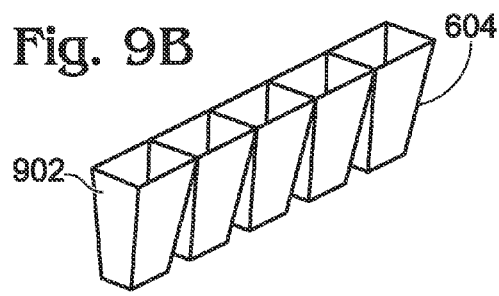
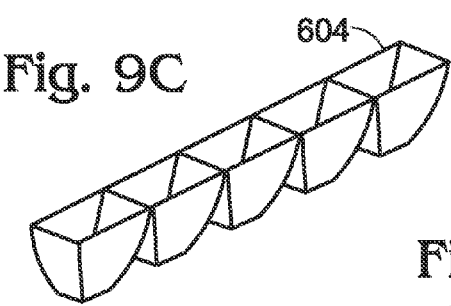
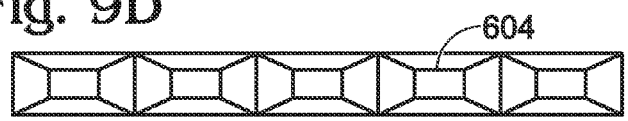
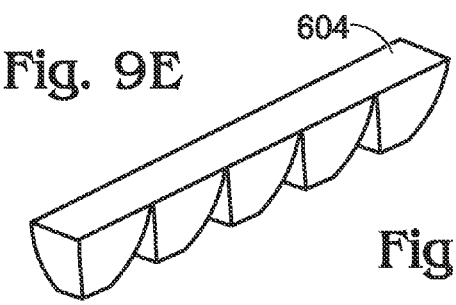
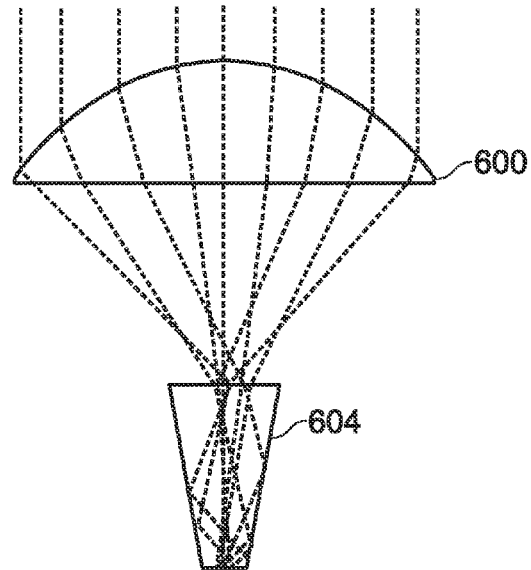

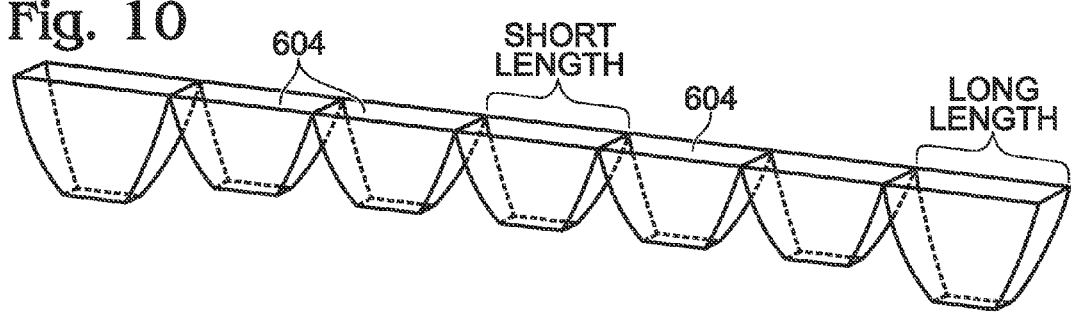
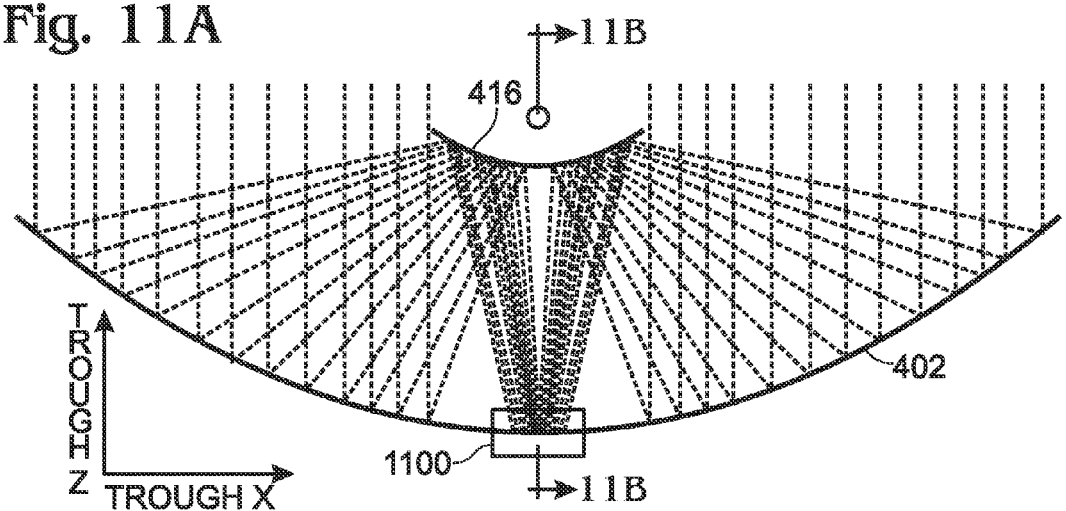
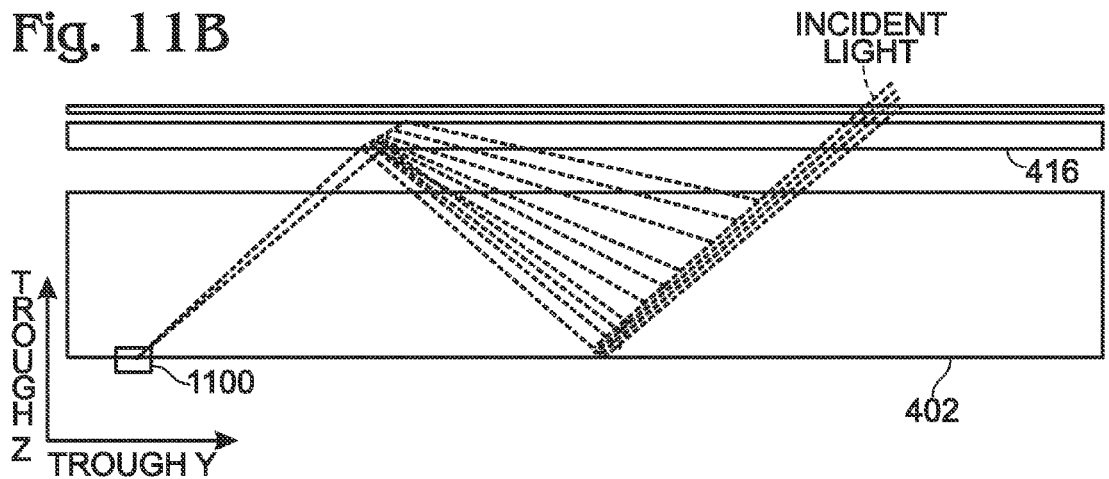

US 9,773,934 B2

HYBRID TROUGH SOLAR POWER SYSTEM USING PHOTOVOLTAIC TWO-STAGE LIGHT CONCENTRATION

This invention was made with Government support under DE-AR0000465 awarded by DOE. The Government has certain rights in this invention.

BACKGROUND OF THE INVENTION

1. Field of the Invention

This invention generally relates to solar generated power and, more particularly to a hybrid system that combines thermal and photovoltaic for energy generation and thermal storage.

2. Description of the Related Art

FIG. 1 is a solar energy collection device using a parabolic trough (prior art). The design of Brunotte et al. [1] is one of the earliest to attempt to convert a line focus into a series of higher concentration foci. In this design, a parabolic trough is used to illuminate a series of solid compound parabolic concentration (CPC) secondaries, each conjugate to a single photovoltaic (PV) cell. The trough is tracked about a polar-aligned axis, so the range of skew angles is limited to +/−23.5° throughout the year. The CPC's have square or rectangular apertures, and may have an asymmetric acceptance angle. The acceptance angle in the transverse plane of the trough is determined by the maximum rim angle of the trough. If an asymmetric trough is used, as shown, then the CPC's can be tilted to a median angle, and the acceptance angle is only half the rim angle of the trough. In the other dimension (along the axial plane of the trough), the CPCs are required to have an acceptance angle of +/−23.5°, to maintain seasonal performance.

FIGS. 2A and 2B depict a design of tracking secondaries for conventional troughs, off-axis troughs, and Cassegrain troughs (prior art). Cooper et al. [3] and Thesan S.p.a. [4] both employ a second degree of tracking freedom. In addition to single-axis trough tracking, the secondary optics are allowed to rotate or translate to compensate for the changing incidence angle (within the axial plane of the trough). The secondaries include hollow, rotating CPCs and solid dielectric reflectors. A design with an array of hollow CPCs operates near the prime focus. Alternatively, a laterally-translated cylinder or spherical lenses may be used [4].

FIG. 3 is a partial cross-sectional view depicting reflected and transmitted wavelength bands of a M2 spectrum splitter (prior art). In principle, such a design permits ultraviolet (UV) and infrared (IR) light to be collected as thermal energy at heat receiver 1 (HR1), and visible (Vis) and near infrared (NIR) to be collected as photovoltaic energy. A Cassegrain geometry poses a new obstacle to achieve high concentration. Since Cassegrain optics have a large focal length, the solar image formed below M2 is likewise larger. The primary concentration from a Cassegrain trough is thus lower than it would be at the prime focus. In order to keep the solar image small after the Cassegrain M2, the M2 size should be very large. However, this causes M2 to cast a large shadow on M1 (the trough). Alternatively, M2 can be made very small so that there is minimum shadowing effect. However, the size of the solar image at the base of the trough becomes very large. An alternative approach would require raising the receiver (photovoltaic cells) to be closer to M2. This allows some reduction in the focal length. However, this may affect trough stability due to a raised center of gravity. Therefore, without additional concentration, this design is impractical for both concentrated photovoltaic (CPV) and concentrated solar power (CSP) purposes.

U.S. Pat. No. 5,505,789 uses a tessellating line focus with solid secondary funnels to address the above-mentioned problems associated with Cassegrain optics [5]. U.S. Pat. No. 5,505,789 discloses line-focus lenses and a line-focused PV module. The whole system is an array of linear arched Fresnel lenses with a linear PV cell receiver located along the focal line of each lens. The photovoltaic cell receiver consists of high efficiency cells interconnected in a string with a solid secondary optical element adhesive bonded to the cells. The entrance aperture of each secondary optical element is rectangular in shape and the optical secondaries are butted up against each other in a line to form a continuous entrance aperture along the focal line. In addition to providing more concentrated sunlight, the solid optical secondaries shield the cells from air, moisture, and contaminants, and to a lesser extent against radiation damage. However, since this system does not employ Cassegrain optics or an additional means of concentrating light to the PV cells, it is a low concentrated CPV system. It is not obvious that this system can be modified to use Cassegrain optics, or that the light collected in such a system can be concentrated sufficiently for PV collection, in light of all the reasons mentioned above.

Other beam splitting approaches for solar power include Imenes et al. [6], dichroic filter designs for hybrid solar energy by DeSandre et al. [7], analysis of hybrid solar energy efficiencies by Hamdy et al. [8], and designs of hybrid solar systems by Soule et al. [9, 10].

FIG. 4 is a partial cross-sectional view of a Cassegrain hybrid trough system with PV at the bottom of the trough [11] (prior art). A similar Cassegrain trough system with beam splitter, but with no concentration at PV cells in a slit at vertex of trough is described by Jian et al. [12].

It would be advantageous if a hybrid solar system using Cassegrain optics could be designed to optimally collect both thermal and PV energy.

[1] "Two-stage concentrator permitting concentration factors up to 300× with one-axis tracking", Brunotte, M., Goetzberger, A., & Blieske, U. (Jan. 1, 1996). *Solar Energy*, 56, 3, 285-300.

[2] "BICON: high concentration PV using one-axis tracking and silicon concentrator cells", Mohr, A., Roth, T., & Glunz, S. W. (Jan. 1, 2006). *Progress in Photovoltaics*, 14, 7, 663-674.

[3] "Theory and design of line-to-point focus solar concentrators with tracking secondary optics", T. Cooper. G. Ambrosetti, A. Pedretti, and A. Steinfeld, Appl. Opt. vol. 52, 8586-8616 (2013).

[4] "Solar Receiver for a Solar Concentrator with a Linear Focus", A. Balbo Divinadio and M. Palazzetti, Thesan S.p.a., US 2011/0023866, Published Feb. 3, 2011.

[5] "Line-focus photovoltaic module using solid optical secondaries for improved radiation resistance", L. M. Fraas and M. J. Oneill, Entech Inc., U.S. Pat. No. 5,505,789, Granted Apr. 9, 1996.

[6] "Spectral beam splitting technology for increased conversion efficiency in solar concentrating systems: a review", A. G. Imenes and D. R. Mills. Solar Energy Materials & Solar Cells. Vol. 84, pp 19-69 (2004).

[7] "Thin-film multilayer filter designs for hybrid solar energy conversion systems", L. DeSandre, D. Y. Song, H. A. Macleod, M. R. Jacobson, and D. E. Osborn, Proceedings of the SPIE Vol. 562, pp 155-159 (1986).

[8] "Spectral selectivity applied to hybrid concentration systems", M. A. Hamdy, F. Luttmann, D. E. Osborn, M. R. Jacobson, and H. A. Macleod, Proceedings of the SPIE Vol. 562, pp 147-154 (1986).

[9] "Efficient hybrid photovoltaic-photothermal solar conversion system with cogeneration", D. E. Soule, E. F. Rechel, D. W. Smith, and F. A. Willis, SPIE Vol. 562, pp 166-173 (1985).

[10] "Heat-Mirror Spectral Profile Optimization for TSC Hybrid Solar Conversion", D. E. Soule and S. E. Wood, SPIE Vol. 653, p 172-180 (1986).

[11] "Bandwidth and angle selective holographic films for solar energy applications", C. G. Stojanoff, J. Schulat, and M. Eich, SPIE Vol. 3789, pp 38-49 (1999).

[12] "Optical modeling for a two-stage parabolic trough concentrating photovoltaic/thermal system using spectral beam splitting technology", S. Jian, P. Hu, S. Mo, and Z. Chehn, Solar Energy Materials and Solar Cells vol. 94 1686-4696 (2010).

SUMMARY OF THE INVENTION

Hybrid solar generators employing a dichroic spectrum splitter, and the problems associated with these designs have been explored extensively, as described above in the Background Section. The system described herein improves upon conventional methods using a low-concentration line focus from the Cassegrain trough, by further concentrating to higher levels, the focused sunlight required by concentrated photovoltaic (CPV) cells. Along a line focus, sunlight that has already been concentrated in one dimension is difficult to further concentrate in that same direction. However, significant additional concentration is possible in the direction orthogonal to the line focus. This leads to a two-step architecture, where the final concentration is a result of two orthogonal operations.

A Cassegrain solar concentrator is used to split the solar spectrum into two bands. T band wavelength light, e.g., ultraviolet (UV) and infrared (IR) light, is allowed to pass through a dichroic secondary mirror (M2) and is absorbed by a standard thermal receiver. The R band wavelength light (e.g., visible (Vis) and near IR (NIR) light) is reflected by M2, forming a medium-concentration solar image below M2. The focal length of the Vis-NIR band is longer than that of the UV/NIR band. In the absence of the system disclosed herein, the Vis-NIR focus is unsuitable for CPV applications. The only potentially economically viable option would be to cover the entire Vis-NIR focus area with single-junction (i.e. p-n junction) PV cells. By introducing an array of rotating refractive optics near the medium-concentration line focus, additional concentration can be gained in the direction orthogonal to the original concentration.

Thus, the hybrid CPV system converts solar power into both electricity and thermal energy by splitting the solar spectrum into two wavelength bands. The visible and near infrared spectra are used for direct electricity production through CPV devices, taking advantage of maximum CPV efficiency in this wavelength band. The ultraviolet and infrared spectra are used for thermal energy collection, where the heat is conveyed to a central power block via a heat transfer fluid (HU). Thus, the hybrid system can deliver higher energy (combined electrical and thermal energy) than either a CPV or concentrated solar power (CST) system alone. That is, the hybrid system not only generates variable electricity but also produces dispatchable thermal energy for low cost and high capacity thermal storage. The added-on storage capacity, besides electricity generation, poises the hybrid system to be a well-balanced power generation system. Dispatchability addresses grid needs by delivering power when the demand is high. Thus, a grid tied hybrid system can sell electricity at the peak price to maximize revenues for utility companies and reduce fossil fuel consumption.

Accordingly, a solar power method is provided using two-stage light concentration to drive CPV conversion in conjunction with thermal collection. The method concentrates light rays received in a plurality of transverse planes towards a primary linear focus in an axial plane, which is orthogonal to the transverse planes. T band wavelengths of light are transmitted to the primary linear focus. R band wavelengths of light are reflected towards a secondary linear focus in the axial plane, which is parallel to the primary linear focus. The light received at the primary linear focus is translated into thermal energy. The light received at the secondary linear focus is focused by a plurality of optical elements aligned along the secondary axis, into a plurality of tertiary linear foci, which are orthogonal to the axial plane. The light focused by the optical element in each tertiary primary focus is concentrated into a plurality of receiving areas, and translated into electrical energy.

In one aspect, a reflective trough, having a primary axis and a parabolic curved surface, concentrates light rays received in the plurality of transverse planes towards the primary linear focus. A dichroic spectrum splitter having a hyperbolically curved surface, an axis aligned in parallel to the primary linear focus, and a position between the secondary linear focus and the primary linear focus, transmits the T band wavelengths of light and reflects the R band wavelengths light. A plurality of optical elements focuses the R band wavelengths of light received at the secondary linear focus along a corresponding plurality of tertiary linear foci. A plurality of optical funnels concentrates the focused light in each tertiary primary focus into a corresponding plurality of receiving areas.

Additional details of the above-described method and a hybrid trough solar power system are presented below.

BRIEF DESCRIPTION OF THE DRAWINGS

FIGS. 7A through 7C are views of an exemplary concentrating optics section.

FIGS. 8A through 8D depict exemplary optical element forms.

FIGS. 9A through 9F depict exemplary optical funnel designs.

FIG. 10 is a perspective drawing depicting an array of optical funnels with varying aperture lengths.

FIGS. 11A through 11D describe the system of FIG. 5 from a different perspective.

DETAILED DESCRIPTION

Figure 1:
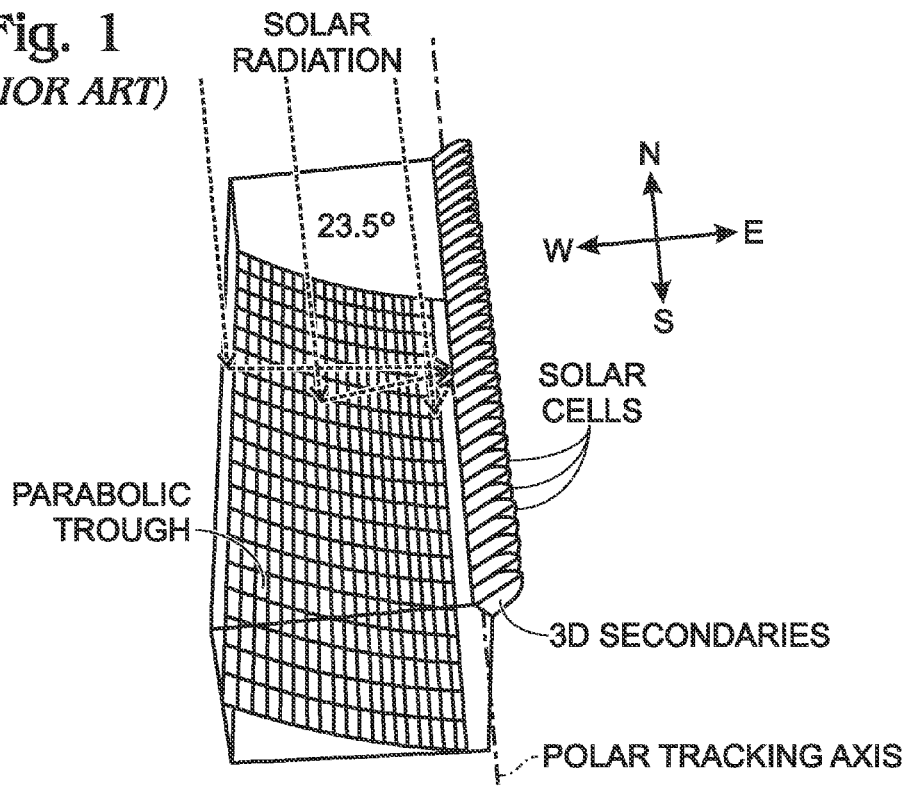
FIG. 1 is a solar energy collection device using a parabolic trough (prior art).
Figure 2A:
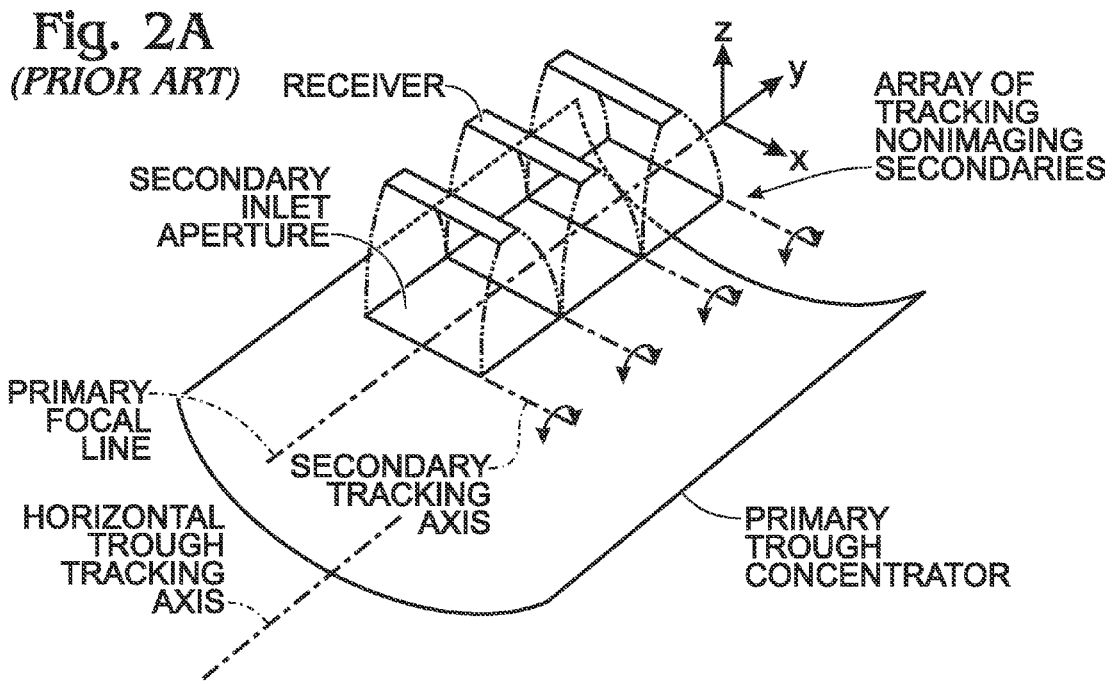
FIGS. 2A and 2B depict a design of tracking secondaries for conventional troughs, off-axis troughs, and Cassegrain troughs (prior art).
Figure 2B:
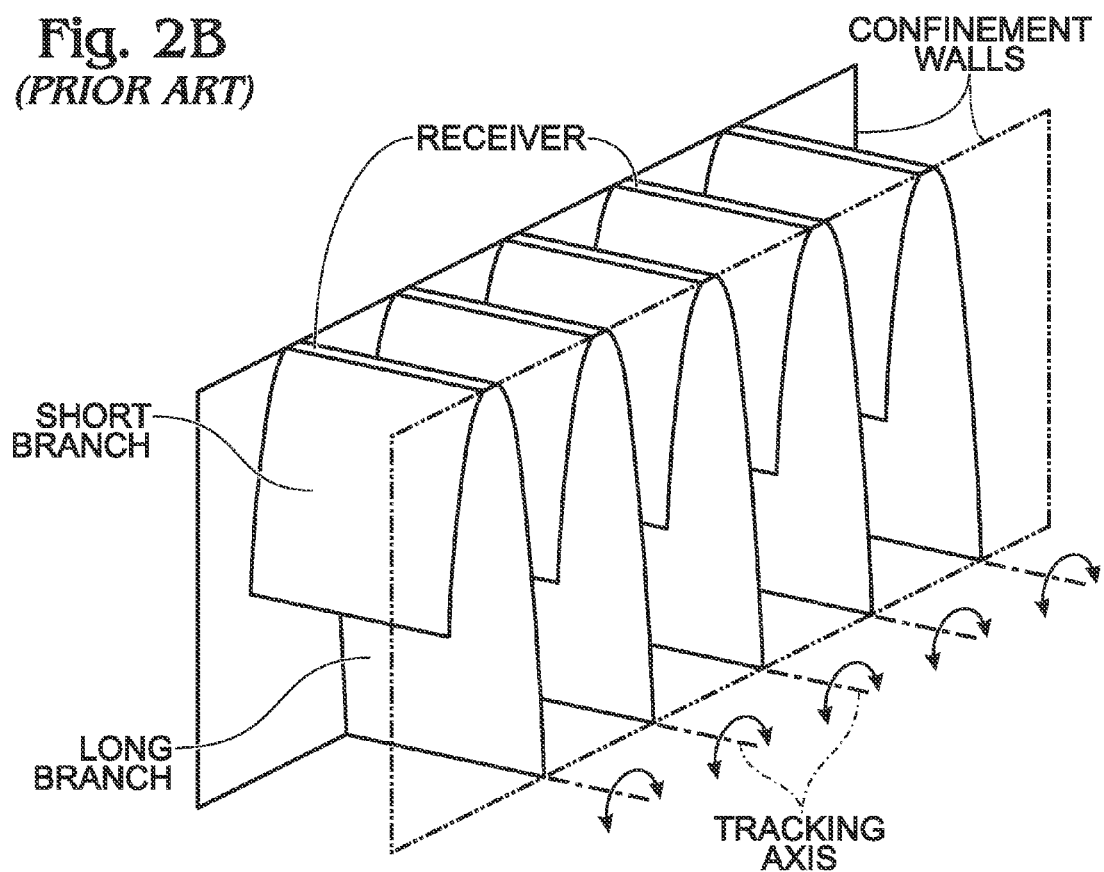
Figure 3:
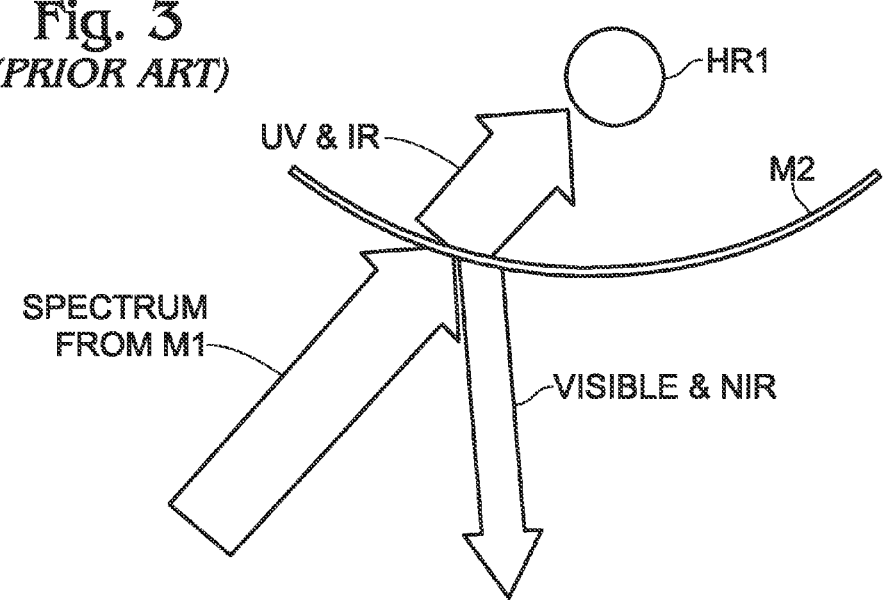
FIG. 3 is a partial cross-sectional view depicting reflected and transmitted wavelength bands of a M2 spectrum splitter (prior art).
Figure 4:
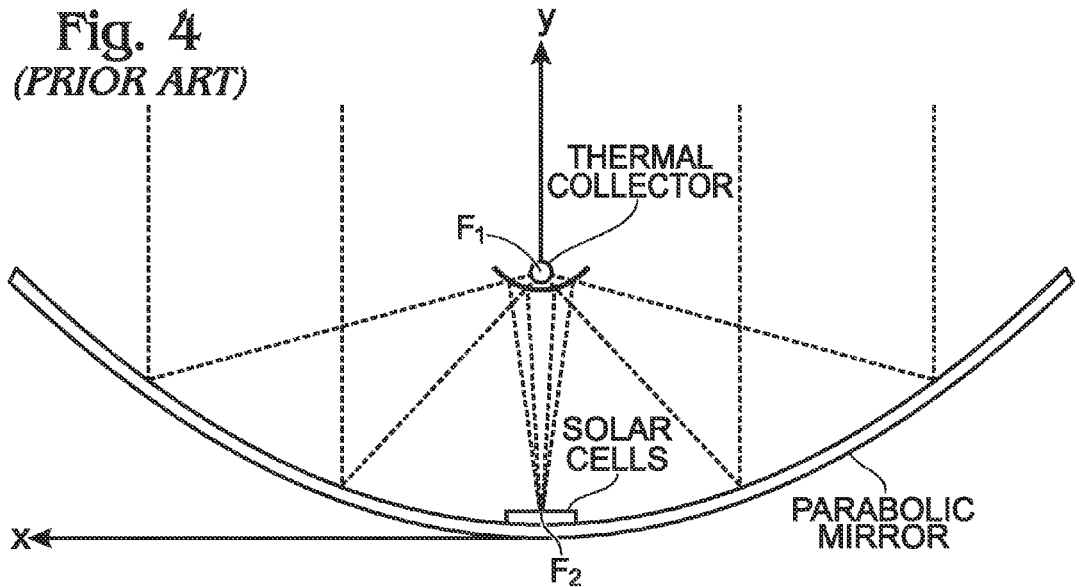
FIG. 4 is a partial cross-sectional view of a Cassegrain hybrid trough system with PV at the bottom of the trough [11] (prior art).
Figure 5:
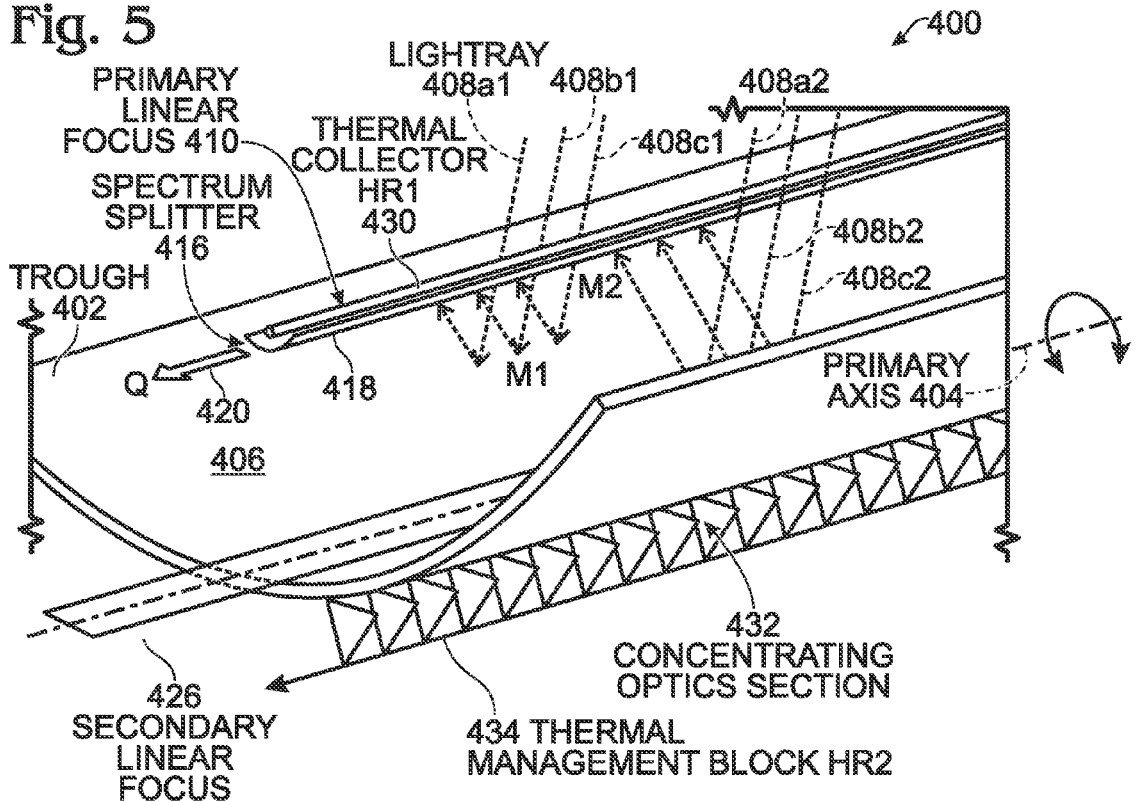
FIG. 5 is a perspective view of a hybrid trough solar power system using two-stage light concentration to drive concentrating photovoltaic (CPV) conversion in conjunction with a thermal collector.

FIG. 5 is a perspective view of a hybrid trough solar power system using two-stage light concentration to drive concentrating photovoltaic (CPV) conversion in conjunction with a thermal collector. The system 400 comprises a reflective trough 402 having a primary axis 404 and a parabolic curved surface 406 for concentrating light rays (e.g., light rays 408a1 through 408c2) received in a plurality of transverse planes into a primary linear focus 410 in an axial plane (not shown), orthogonal to the transverse planes. For example, light rays 408a1 and 408a2 are in one transverse plane and light rays 408c1 and 408c2 are in another transverse plane. In one aspect, the reflective trough 402 is rotatable about the primary axis 404.

A dichroic spectrum splitter 416 has a hyperbolically curved surface 418, an axis 420 aligned in parallel to the primary linear focus 410, and a position between the reflective trough 402 and the primary linear focus 410. In one aspect, the T band wavelengths of light include both wavelengths greater than near infrared (NIR) and less than FIR, and the R band wavelengths include NIR wavelengths of light.

Figure 6A:
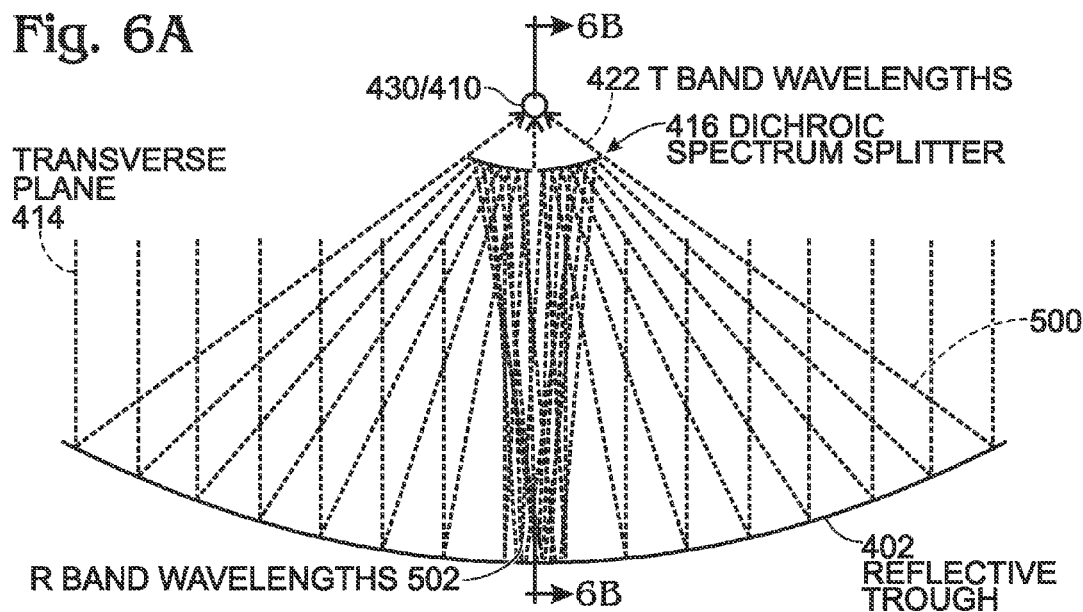
FIGS. 6A and 6B are partial cross-sectional views of the dichroic spectrum splitter.
Figure 6B:
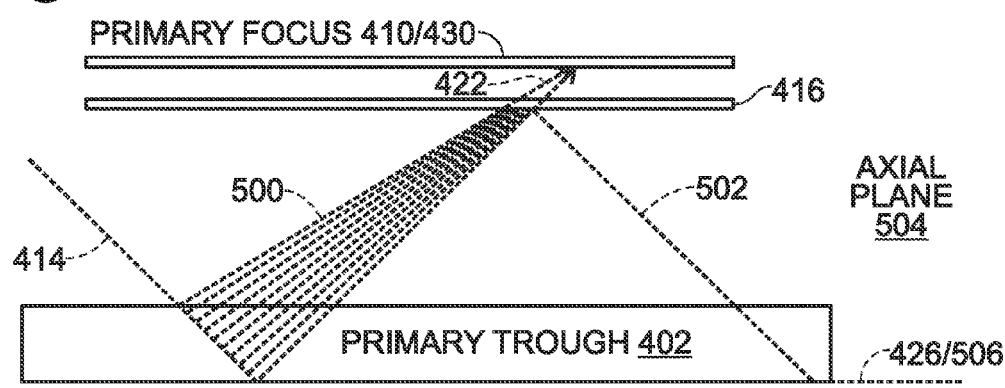
Figure 11C:
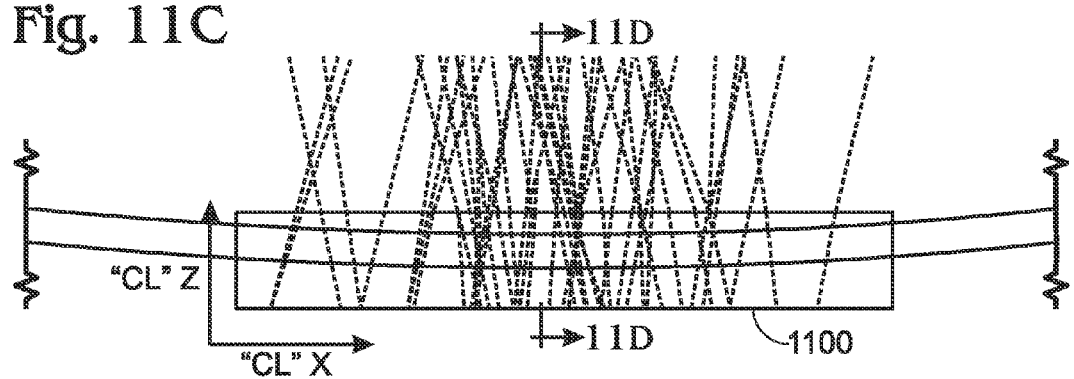
Figure 11D:
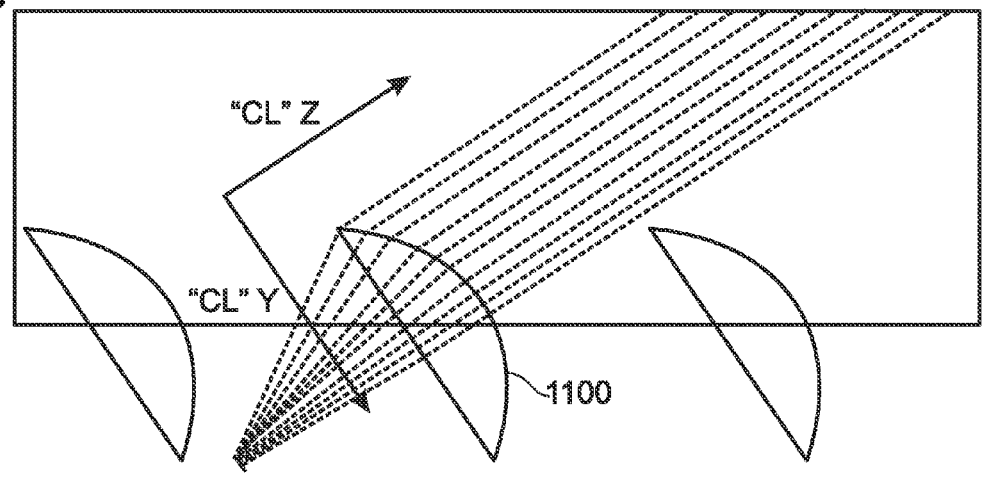

FIGS. 6A and 6B are partial cross-sectional views of the dichroic spectrum splitter 416. Light rays accepted by the reflective trough 402 in transverse plane 414 are reflected to the dichroic spectrum splitter, as represented by rays 500. The dichroic spectrum splitter 416 transmits T band wavelengths of light 422, and reflects R band wavelengths light 502 to a secondary linear focus 426 formed parallel to a vertex 506 of the reflective trough 402 in the axial plane 504. In this example, the secondary linear focus 426 and the vertex 506 are collocated, and the axial plane 504 is plane facing the reader in FIG. 6B (i.e. the sheet upon which FIG. 6B is formed). A thermal collection tube 430 (HR1) is aligned along the primary linear focus 410 for the light transmitted by the dichroic spectrum splitter 416. For simplicity, the thermal collection tube 430 is shown aligned along the primary linear focus 410.

Returning to FIG. 5, a plurality of concentrating optics sections 432 are formed in series along the secondary linear focus 426. Ideally, the secondary linear focus would be a narrowly focused line in the axial plane. However, due to the longer focal length of the Cassegrain optical path, the secondary linear focus 426 is of lower concentration than the primary linear focus 410. The secondary linear focus is represented here as a narrow plane transverse to the axial plane. As explained below, concentrating optics sections are used to boost the concentration of the second linear focus 426.

FIGS. 7A through 7C are views of an exemplary concentrating optics section 432. Each concentrating optics section 432, also referred to herein as concentrating lens (CL) optics, comprises an optical element 600 for focusing the R band wavelengths of light reflected by the dichroic spectrum splitter along a tertiary linear focus 602, orthogonal to the axial plane. A plurality of optical funnels 604 concentrate the R band wavelengths of light focused by the optical element 600 to a corresponding plurality of receiving areas 606. A plurality of PV devices 608 each have an optical interface formed at a corresponding receiving area 606. In one aspect, the PV devices 608 are multi-junction cells, each junction having an energy bandgap converting R band wavelengths of light to electrical current. For example, if the dichroic spectrum splitter reflects light in the R band of wavelengths between 500 and 810 nanometers (nm), then the PV devices 608 may be double junction tandem cells with energy bandgaps of 1.88 electron volts (eV) and 1.43 eV, or triple junction tandem cells with an energy bandgaps of 2.05 eV, 1.77 eV, and 1.43 eV. Alternatively, if the dichroic spectrum splitter reflects light in the R band of wavelengths between 650 and 850 nm, the PV devices 608 may be single junction cells with an energy bandgap of 1.43 eV. In another aspect, if the dichroic spectrum splitter reflects light in the R band of wavelengths between 700 and 1000 nm, then the PV devices 608 may be single junction cells with an energy bandgap of 1.1 eV.

Each optical element 600 has an optical input aperture 610 elongated orthogonal to the axial plane. Likewise, each optical funnel 604 in the concentrating optics section 432 has an optical input aperture 612 underlying the lens 600 and elongated orthogonal to the axial plane.

In one aspect, each optical element 600 has an optical input aperture first axial plane-width 614 in an aperture (e.g., horizontal) plane, where the aperture plane is orthogonal to the axial plane. Each optical element 600 focuses light along the tertiary linear focus 602, coincident with the elongated optical funnel input apertures 612 in the axial plane, to a second axial plane-width 616, smaller than the first width 614. In another aspect, each concentrating optics section 432 is rotatable about an axis (e.g., in the tertiary plane, see FIG. 7A) formed orthogonal to the axial plane.

Returning briefly to FIG. 5, a thermal collector or thermal cooling blocks, represented by reference designator 434 (HR2), may optionally attached to the PV devices.

FIGS. 8A through 8D depict exemplary optical element forms shapes. FIG. 8A depicts a linear Fresnel lens 600, FIG. 8B depicts an acylindrical lens 600, and FIG. 8C depicts a cylindrical lens 600. A Fresnel lens can be inexpensively hot embossed in a plastic, such as poly(methyl methacrylate) (PMMA). However, Fresnel lenses have losses from scattered light and are difficult to coat. Acylinder lenses have less scattering, but require more material. Glass acylinder lenses can be anti-reflective (AR) coated to reduce loss. FIG. 8D depicts optical element 600 enabled as a compound parabolic concentrator (CPC). More explicitly, the concentrating optics section 432 comprises a first CPC 600 with an input aperture elongated in a transverse plane, with a plurality of optical funnels enabled as second CPCs or flat wedges 604 underlying the first CPC, with input apertures elongated in the axial plane.

FIGS. 9A through 9F depict exemplary optical funnel designs. FIGS. 9A and 9B illustrate a hollow optical funnel 604 with inner reflective surfaces 900. As shown in these figures, the facets or outside surfaces 902 may be flat, as shown in FIG. 9B, or curved as shown in FIG. 9C. For example, the optical funnel 604 may have curved exterior surfaces 902 shaped as a compound parabolic concentrator (CPC). Alternatively, as shown in FIGS. 9D and 9E the CPC may be a solid. In one aspect, the optical funnels may be a dielectric material with exterior surface facets that are either curved or flat, that transmit R band wavelengths of light accepted at an optical input aperture, initially by refraction, and subsequently to a corresponding receiving surface via total internal reflection (TIR), see FIG. 9F.

In one aspect, a cylinder lens with aspheric profile (also called an acylinder lens) is paired with a row of rectangular glass or plastic CPC funnels. CPCs are non-imaging elements which optimally collect light within a well-defined acceptance angle. The smaller the acceptance angle, the greater is the potential concentration. Since the acylinder lens operates at a very fast focal ratio, the funnels are not able to provide much additional concentration in the axial plane. However, since the Cassegrain trough inherently operates at a very slow focal ratio, significant additional concentration is possible in the transverse plane, especially if the funnels are solid dielectrics bonded to the cells. In the transverse plane (X-dimension), the funnels provide gaps between adjacent cells. These inactive regions between the cells are useful for wiring, bypass diodes, etc.

The CPC funnels may have asymmetric acceptance angles. In the X-direction, the acceptance angle is tailored to accept all rays from the spectrum splitter, which subtends a relatively small angle from the vertex of the trough. In the Y-direction, the acceptance angle is tailored to accept all light from the edge of the concentrating optics section. If the concentrating optics sections operate at a fast focal ratio, this angle is large and only modest additional concentration is realized.

As shown in FIG. 5, solar radiation is concentrated in two successive orthogonal stages. First, the primary mirror M1 (reflective trough 402) and dichroic mirror M2 (spectrum splitter 416) form a line focus of medium concentration along the secondary linear focus 426. Second, an array of concentrating lens (CL) optics (i.e. concentrated optics sections 432) divide the line focus into discrete bins and perform additional concentration in the direction orthogonal to the primary line focus. The focal length of the CLs 432 is much smaller than the focal length of the Cassegrain trough 402. Since these two stages have very different focal lengths, the CL array gives a series of foci with very high aspect ratios. The system 400 allows the division of these elongated foci onto individual cells. First, a linear refractive lens, such as a cylinder lens or linear Fresnel lens, concentrates the light orthogonal to the overall line focus. Then, a series of solid or hollow funnels divides the light into smaller regions, each corresponding to a single cell. These regularly-spaced cells are preferably connected in parallel to allow tolerance for irradiance variations.

FIG. 10 is a perspective drawing depicting an array of optical funnels with varying aperture lengths. The distribution of light in the dimension of concentration performed by the trough is set by the trough prescription, optical errors, and tracking errors. The convolution of these errors results in a line spread function which is roughly Gaussian. When convolved with the top-hat angular spread of the sun, the distribution is further broadened, with highest irradiance in the center. This would direct more light to the center cells. In order to improve the cell-to-cell irradiance matching, the optical funnel elements may be irregularly sized such that the outer funnels have larger input apertures in the transverse plane. This directs more light to the edge cells, which on average are light-starved compared to the center cells. In order to accommodate irregular entry faces (long and short aperture lengths), the heights of the funnels may also vary, as shown. The exit apertures for all seven funnels in this example are equal in size.

In one exemplary system, the Cassegrain trough has a focal length of 7770 millimeters (mm), while the second-stage optics (dichroic spectrum splitter) operating in the orthogonal direction has a focal length of ~50 mm. This produces a paraxial solar image with an aspect ratio of ~1:150. With aberrations in the second stage, the actual aspect ratio is less severe. Since the first stage has a very long focal ratio, additional concentration is possible in the primary concentration dimension. This is achieved with an array of dielectric funnels that may have flat or curved side walls. Those funnels may be compound parabolic concentrators (CPCs). The large ends of the funnels meet edge-to-edge and tessellate the elongated focus of the two-stage concentrator. The small ends are bonded to individual PV cells. The segmentation is very beneficial, since it provides inactive regions between cells for wiring, bypass diodes, etc.

FIGS. 11A through 11D describe the system of FIG. 5 from a different perspective. The reflective trough is able to rotate about its primary axis (i.e. parallel to the trough Y-axis). The CL optics 1100 move with the trough and rotate additionally about a local axis parallel to the CL X-axis. This rotation compensates for the residual incidence angle in the axial plane of the trough. The CL optics tessellate the trough secondary line focus, shown here at the base vertex of the trough. As the incidence angle changes, the CLs individually rotate such that their local Y-axes remain nearly perpendicular to the incoming light. This results in an unavoidable self-shadowing between adjacent CL elements, with the magnitude of the shadowing scaling with (1-cos θ), where θ is the incidence angle. Only the solar rays in the R band are illustrated here; they all reflect off the dichroic secondary (spectrum splitter) 416. Solar rays in the thermal band transmitted through spectrum splitter are absorbed by the thermal receiver. For clarity, only the optical elements (lenses), but not the optical funnels, are shown.

The CL aperture in the X-direction (traversing the primary linear focus) is determined by the width of the aberrated solar image produced by the trough. For full collection, the CL must be as wide as the aberrated solar image on the winter solstice noon (the time of year which results in the largest incidence angle). The CL aperture in the Y-direction is driven by mechanical and electrical considerations. If the cell groups below each CL aperture are connected in parallel, then the CL Y-dimension is chosen to maintain a reasonable electrical current in the corresponding cell group.

FIGS. 12A through 12D depict the system of FIGS. 11A through 11D operating at different angles of the sun. The outputs of the CL elements 1100 are highly elongated solar images. The CL elements and their corresponding receivers move together as a unit, rotating as a package about an axis parallel to the local X-axis. The CL elements may be used to directly illuminate thin rows of PV cells 608. However, since cells 608 may be arranged edge-to-edge, any gap between cells in the X-direction constitutes a loss, as shown in FIG. 121). In the embodiments shown here, the CL 1100 array is positioned near the trough vertex. Alternatively, the CL array may be positioned above or below the vertex.

Figure 12A:
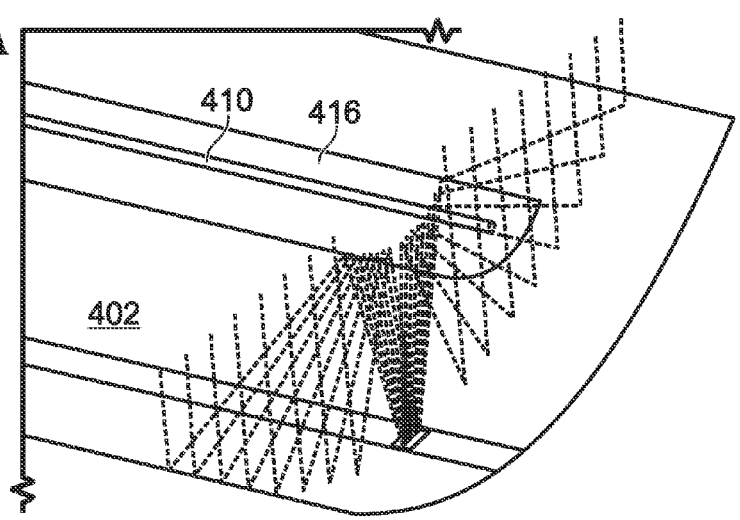
FIGS. 12A through 12D depict the system of FIGS. 11A through 11D operating at different angles of the sun.
Figure 12B:
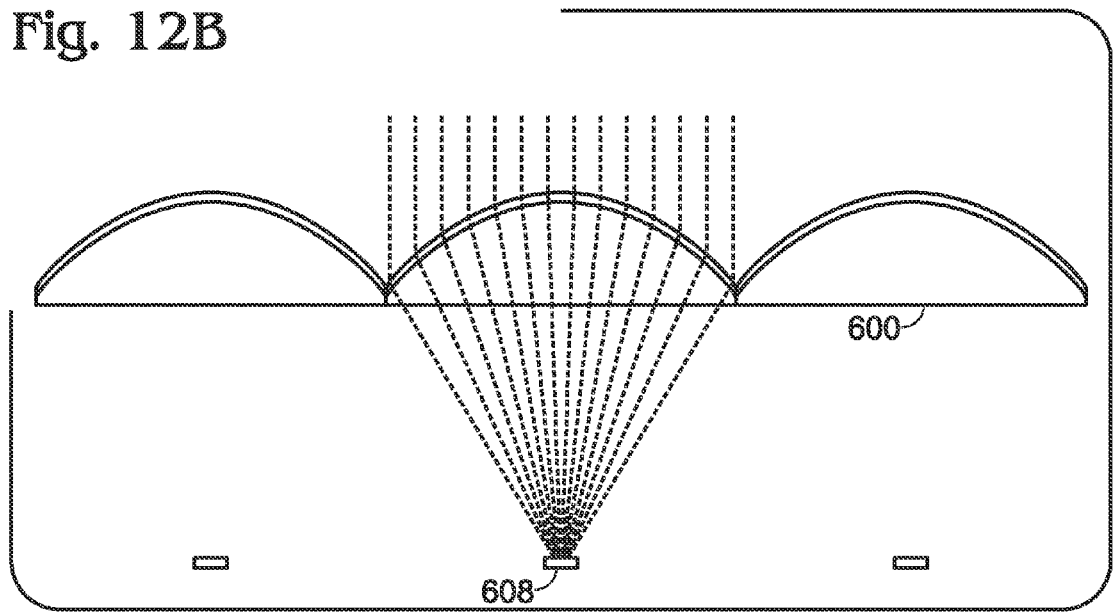
Figure 12C:
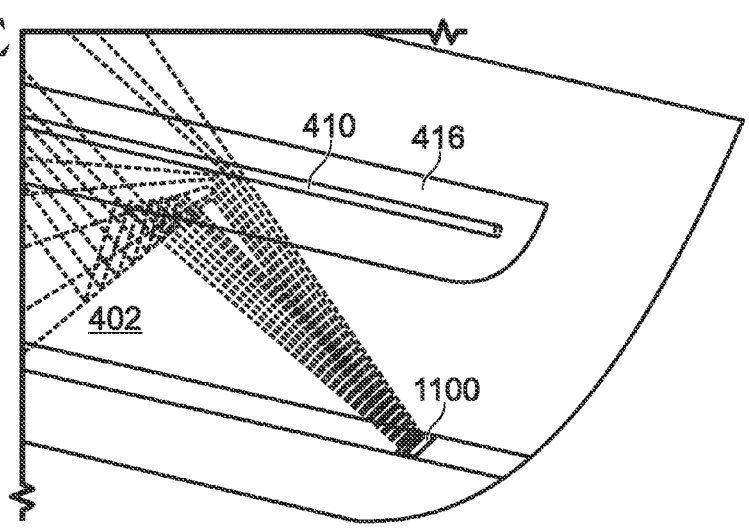
Figure 12D:
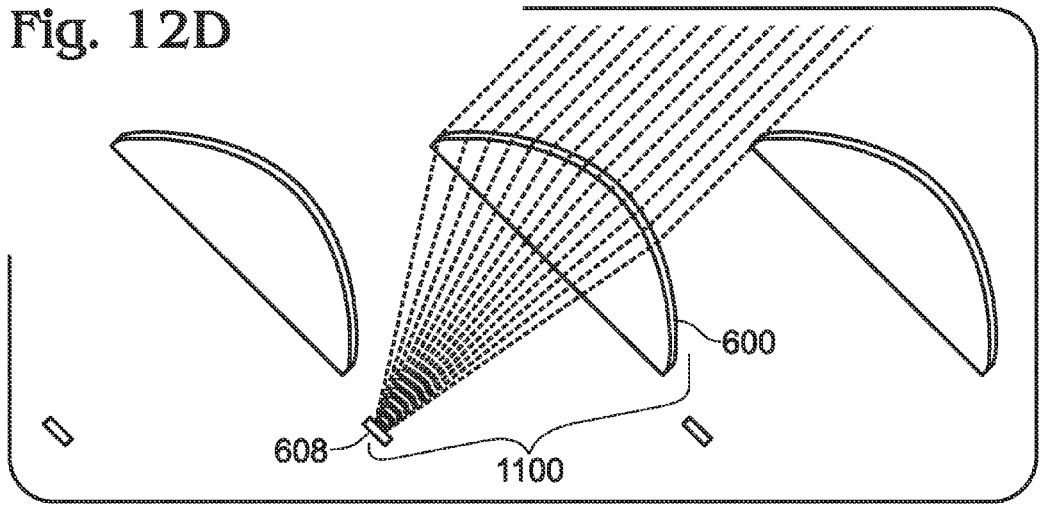

A trough tracked about a horizontal, North-South oriented axis receives on-axis solar radiation at multiple times throughout the year, including the equinox sunrise or sunset. At the summer solstice, noon, (FIGS. 12A and 12B), the sun is almost straight over the trough with an incident angle of $|\phi|-\in$, where $\phi$ is the site latitude and $\in=23.5°$, the declination of Earth. For example, at Tucson Ariz., this incident angle is 8° on summer solstice noon, very close to on axis situation shown in FIGS. 12A and 12B. Therefore, the CLs 1100 are pointing almost straight up to the spectrum splitter 416 (M2). One extreme illumination condition is noon on the Winter solstice (FIGS. 12C and 12D). In this case, the incidence angle is $|\phi|+\in$, where $\phi$ is the site latitude and ∈=23.5°, the declination of Earth. An off-axis (θ=45°) illumination condition is depicted. The CL optics rotate to optimally focus the incoming light onto the receiver surface.

As described above, in one aspect the receiving surface is tessellated with a row of funnel-like optics, each with its entrance aperture meeting edge-to-edge with the adjacent funnels. The smaller exit apertures are positioned over individual PV cells. Thus, each CL unit is composed of an upper concentrating lens over an array of funnels. The elements move together as a group, such that the upper lens, lower funnels, and PV cells maintain a fixed spatial relationship to each other. The top optical element and bottom funnels may take on multiple embodiments, as described above.

One challenge is that the width of the solar image in the X-direction is determined by the Cassegrain trough. Skew dilation causes the width of the solar image to change throughout the year. In this case, the optical errors from the trough and the angular width of the sun give a solar image which only fills a few of the center funnel/cell pairs. As the skew angle increases, with an extreme at noon on the Winter solstice, the solar image grows, filling more cells. A tradeoff must be made between annual collection efficiency and geometric concentration. One promising option is to truncate performance near the winter solstice noon condition. The width of the CL may be shortened in the X-dimension, with fewer cells underneath. This causes some loss of light during the extreme illumination cases, but increases the average geometric concentration for most of the year.

This disclosure describes a hybrid CSP-CPV trough solar energy converter. The hybrid system modifies a conventional CSP system by adding a dichroic mirror, a CPV array, secondary tracking, and a thermal management scheme. The CL top optical element and bottom funnels may take on multiple configurations. Both linear Fresnel and acylinder lenses are suitable candidates for the top CL optical element.

The optical funnels may have equally-sized (length) entrance apertures. Since the irradiance profile changes in the X-direction, as a result of the line spread function of the trough, the cells receive unequal illumination. If the cells are wired in parallel, the effects of the mismatch are mitigated. Another approach to equalizing flux between adjacent cells is to increase the entrance apertures of the edge funnels. This may require using unequal height funnels.

In summary, a hybrid trough system has been presented with a reflective trough (M1), heat receiver (HR1), dichroic spectrum splitter (M2), concentrating lens array with PV array, tracking mechanisms in both primary and secondary, trough supporting frames, and a thermal management scheme (HR2) to cool off CPV cells or to harvest waste heat for field heating during night time. The CL array (the array of concentrating optics sections) concentrates light onto PV cells with very high geometric concentration ratio though the orthogonal light management. The CL array is composed of top optical element and bottom funnels, which can take on many embodiments. For example, the top optical element can be an acylinder lens or linear Fresnel lens. The bottom funnels may be hollow or solid, with curved sides (CPC) or flat faceted sides.

Figure 13:
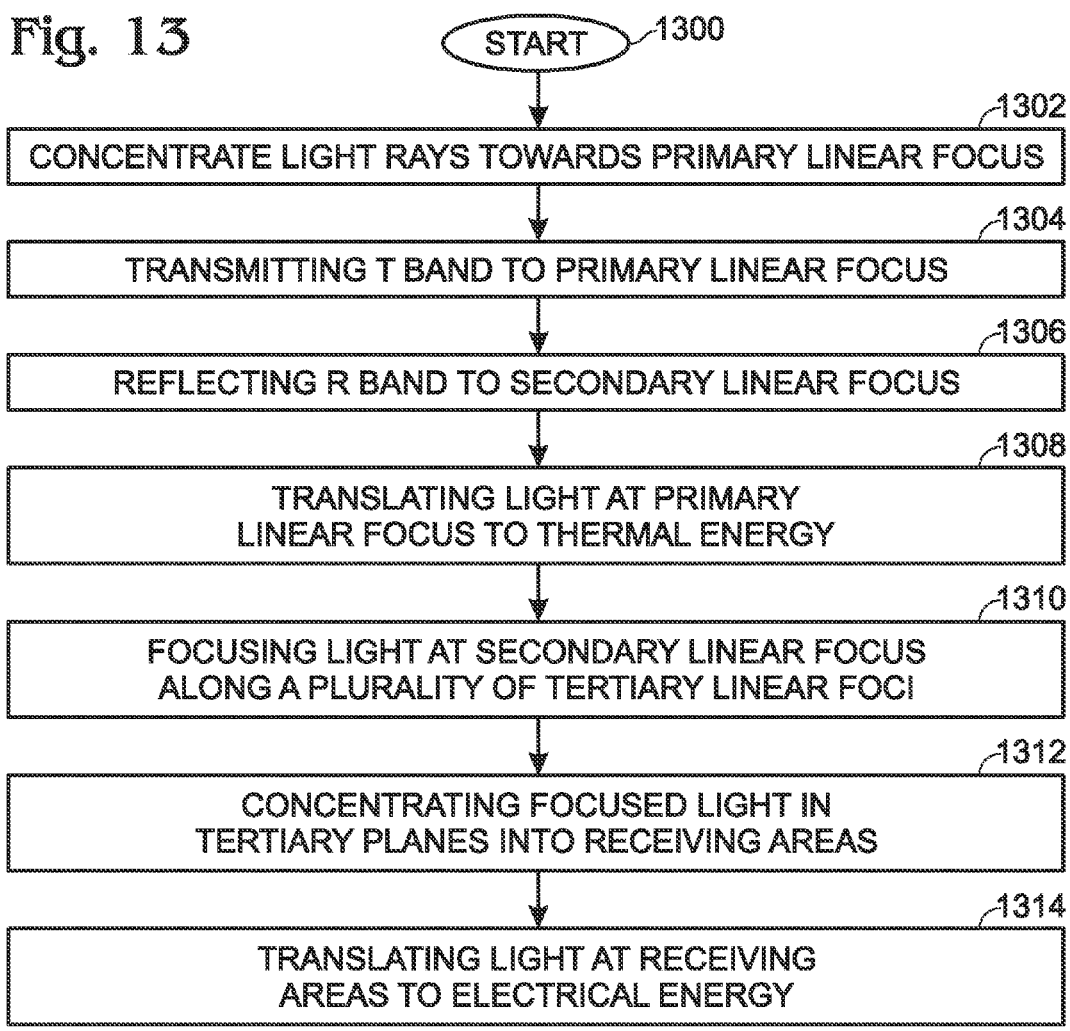
FIG. 13 is a flowchart illustrating a solar power method using two-stage light concentration to drive CPV conversion in conjunction with thermal collection.

FIG. 13 is a flowchart illustrating a solar power method using two-stage light concentration to drive CPV conversion in conjunction with thermal collection. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps and is associated with the system and subcomponents of the system described in FIG. 5. The method starts at Step 1300.

Step 1302 concentrates light rays received in a plurality of transverse planes towards a primary linear focus in an axial plane, orthogonal to the transverse planes. Step 1304 transmits T band wavelengths of light to the primary linear focus. Step 1306 reflects R band wavelengths of light towards a secondary linear focus in the axial plane, parallel to the primary linear focus. Step 1308 translates the light received at the primary linear focus into thermal energy. Step 1310 focuses the light received at the secondary linear focus along a plurality of tertiary linear foci, orthogonal to the axial plane. Step 1312 concentrates the focused light in each tertiary primary focus into a plurality of receiving areas. Step 1314 translates the light accepted at the receiving areas into electrical energy.

In one aspect, concentrating light rays received in Step 1302 includes a reflective trough, having a primary axis and a parabolic curved surface, concentrating the light rays. In another aspect, transmitting light to the primary linear focus (Step 1306), and reflecting light towards the secondary linear focus (Step 1308) include using a dichroic spectrum splitter having a hyperbolically curved surface, an axis aligned in parallel to the primary linear focus, and a position between the secondary linear focus and the primary linear focus. The dichroic spectrum splitter transmits the T band wavelengths of light, and reflects the R band wavelengths light.

In one aspect, focusing the light received at the secondary linear focus in Step 1310 includes a plurality of corresponding optical element focusing the R band wavelengths of light. In another aspect, concentrating the focused light in each tertiary primary focus in Step 1312 includes a plurality of optical funnels concentrating the focused light.

A system and method have been provided for a hybrid trough solar power system to use two-stage light concentration to drive CPV conversion in conjunction with a thermal collector. Examples of particular subcomponents and components layouts have been presented to illustrate the invention. However, the invention is not limited to merely these examples. Other variations and embodiments of the invention will occur to those skilled in the art.

We claim:

1. A hybrid trough solar power system using two-stage light concentration to drive concentrating photovoltaic (CPV) conversion in conjunction with a thermal collector, the system comprising:

a reflective trough having a primary axis and a parabolic curved surface for concentrating light rays received in a plurality of transverse planes into a primary linear focus in an axial plane, orthogonal to the transverse planes;

a dichroic spectrum splitter having a hyperbolically curved surface, an axis aligned in parallel to the primary linear focus, and a position between the reflective trough and the primary linear focus, the dichroic spectrum splitter transmitting T band wavelengths of light, and reflecting R band wavelengths of light to a secondary linear focus formed parallel to a vertex of the reflective trough in the axial plane;

a thermal collection tube aligned along the primary linear focus for the T band wavelengths of light;

a plurality of concentrating optics sections formed in series along the secondary linear focus, each concentrating optics section comprising an imaging optical element focusing the R band wavelengths of light reflected by the dichroic spectrum splitter along a tertiary linear focus orthogonal to the axial plane, a plurality of optical funnels aligned serially in a row along the tertiary linear focus of the imaging optical element, the plurality of optical funnels concentrating the R band wavelengths of light focused by the imaging optical element to a plurality of receiving areas and for each optical funnel, a PV device having an optical interface formed at a corresponding receiving area of the plurality of receiving areas;

wherein each concentrating optics section is independently rotatable about a corresponding local axis, and each local axis is orthogonal to the axial plane; and, wherein the orthogonality of each imaging optical element to the reflected R band wavelengths of light is responsive to the rotation of a corresponding concentrating optics section about its local axis.

2. The system of claim 1 wherein each imaging optical element has an optical input aperture elongated orthogonal to the axial plane; and, wherein the plurality of optical funnels in each concentrating optics section each have an optical input aperture underlying the corresponding imaging optical element and elongated orthogonal to the axial plane.

3. The system of claim 2 wherein each imaging optical element has an optical input aperture first axial plane-width in an aperture plane, where the aperture plane is orthogonal to the axial plane, and each imaging optical element focuses light along the tertiary linear focus to a second axial plane-width, smaller than the first axial plane width.

4. The system of claim 2 wherein each imaging optical element is selected from a group consisting of Fresnel lens, cylindrical lens, and acylindrical lens.

5. The system of claim 1 wherein each optical funnel is hollow with inner reflective surfaces, with facets selected from a group consisting of curved and flat.

6. The system of claim 1 wherein each optical funnel has curved exterior surfaces shaped as a compound parabolic concentrator (CPC).

7. The system of claim 1 wherein each optical funnel is a dielectric material with exterior surface facets selected from a group consisting of flat and curved, transmitting R band wavelengths of light accepted at an optical input aperture, initially by refraction, and subsequently to a corresponding receiving surface via total internal reflection (TIR).

8. The system of claim 1 where the PV devices are selected from the group consisting of single-junction and multi-junction cells, each junction having an energy bandgap converting R band wavelengths of light to electrical current.

9. The system of claim 8 wherein the dichroic spectrum splitter reflects light in the R band of wavelengths between 500 and 810 nanometers (nm); and, wherein the PV devices are selected from a group consisting of double junction tandem cells with energy bandgaps of 1.88 electron volts (eV) and 1.43 eV, and triple junction tandem cells with an energy bandgaps of 2.05 eV, 1.77 eV, and 1.43 eV.

10. The system of claim 8 wherein the dichroic spectrum splitter reflects light in the R band of wavelengths between 650 and 850 nm; and, wherein the PV devices are single junction cells with an energy bandgap of 1.43 eV.

11. The system of claim 8 wherein the dichroic spectrum splitter reflects light in the R band of wavelengths between 700 and 1000 nm; and, wherein the PV devices are single junction cells with an energy bandgap of 1.1 eV.

12. The system of claim 1 wherein the reflective trough is rotatable about the primary axis.

13. The system of claim 1 further comprising:

thermal cooling blocks attached to the PV devices.

14. The system of claim 1 wherein dichroic spectrum splitter transmits T band wavelengths of light both greater than near infrared (NIR) and less than NIR, and reflects R band wavelengths in the NIR wavelengths of light.

* * * * *